US012577675B2

(12) United States Patent
Lakeman et al.

(10) Patent No.: US 12,577,675 B2
(45) Date of Patent: Mar. 17, 2026

(54) SYSTEM AND METHOD FOR MASS FLOW MEASUREMENT AND CONTROL OF PROCESS GASES IN A CARRIER STREAM USING ONE OR MORE QUARTZ CRYSTAL MICROBALANCE SENSORS

(71) Applicant: INFICON, Inc., East Syracuse, NY (US)

(72) Inventors: Steve Lakeman, Newbury Park, CA (US); Mohamed Rinzan, Manlius, NY (US); Chunhua Song, Jamesville, NY (US); Lukas Baumgartel, Portland, OR (US)

(73) Assignee: Inficon, Inc., East Syracuse, NY (US)

( * ) Notice: Subject to any disclaimer, the term of this patent is extended or adjusted under 35 U.S.C. 154(b) by 123 days.

(21) Appl. No.: 18/566,317

(22) PCT Filed: Jun. 2, 2022

(86) PCT No.: PCT/US2022/031884
§ 371 (c)(1),
(2) Date: Dec. 1, 2023

(87) PCT Pub. No.: WO2022/256478
PCT Pub. Date: Dec. 8, 2022

(65) Prior Publication Data
US 2024/0263313 A1      Aug. 8, 2024

Related U.S. Application Data

(60) Provisional application No. 63/196,929, filed on Jun. 4, 2021.

(51) Int. Cl.
*C23C 16/52* (2006.01)
*C23C 16/448* (2006.01)
(Continued)

(52) U.S. Cl.
CPC .......... *C23C 16/52* (2013.01); *C23C 16/4481* (2013.01); *C23C 16/45525* (2013.01);
(Continued)

(58) Field of Classification Search
None
See application file for complete search history.

(56) References Cited

U.S. PATENT DOCUMENTS 5,827,947 A     10/1998  Miller et al.
2014/0182515 A1   7/2014  Yamazaki et al.
(Continued)

FOREIGN PATENT DOCUMENTS

GB        2421738 A  *  7/2006   ........... C23C 14/505

OTHER PUBLICATIONS

Rinzan et al, WO 2019/040843, Quartz Crystal Microbalance Sensor for Fabrication Process Monitoring AND Related Method, Feb. 28, 2019 (Year: 2019).*
(Continued)

*Primary Examiner* — Alexander G Ghyka
(74) *Attorney, Agent, or Firm* — Barclay Damon LLP

(57) ABSTRACT

A method for monitoring precursor material in a carrier stream of a fabrication system comprises depositing a film of precursor material on a surface of a QCM sensor and determining a starting resonance frequency of the QCM sensor with the deposited film of precursor material. The resonance frequency of the QCM sensor is measured during operation of the fabrication system and compared with the starting resonance frequency. A system error is issued when the measured resonance frequency differs from the corresponding starting resonance frequency by more than a threshold value. A system correction is automatically implemented and configured to restore the QCM sensor to the starting resonance frequency.

19 Claims, 4 Drawing Sheets

(51) Int. Cl.
  *C23C 16/455* (2006.01)
  *G01N 29/02* (2006.01)
  *G01N 29/036* (2006.01)
  *G01N 29/44* (2006.01)

(52) U.S. Cl.
  CPC ......... *G01N 29/022* (2013.01); *G01N 29/036* (2013.01); *G01N 29/4409* (2013.01); *G01N 2291/014* (2013.01); *G01N 2291/022* (2013.01)

(56) References Cited

U.S. PATENT DOCUMENTS

| | | |
|---|---|---|
| 2020/0033295 A1 | 1/2020 | Long |
| 2020/0176291 A1 | 6/2020 | Rinzan et al. |
| 2021/0340674 A1* | 11/2021 | Winkler .............. C23C 16/4408 |

OTHER PUBLICATIONS

International Searching Authority; International Search Report and Written Opinion; International Application No. PCT/US22/031884; Date of Mailing: Sep. 13, 2022; 9 pages.
International Preliminary Examining Authority; International Preliminary Report on Patentability; International Application No. PCT/US22/031884; Date of Mailing: Oct. 3, 2023; 4 pages.
European Patent Office; Extended European Search Report; Application No. 22816820.9; Dated: Jul. 1, 2025; 8 pages.
Rocklein M. N. et al: "Temperature-Induced Apparent Mass Changes Observed during Quartz Crystal Microbalance Measurements of Atomic Layer Deposition", Analytical Chemistry, vol. 75, No. 19, Aug. 23, 2003, pp. 4975-4982; 8 pages.

* cited by examiner

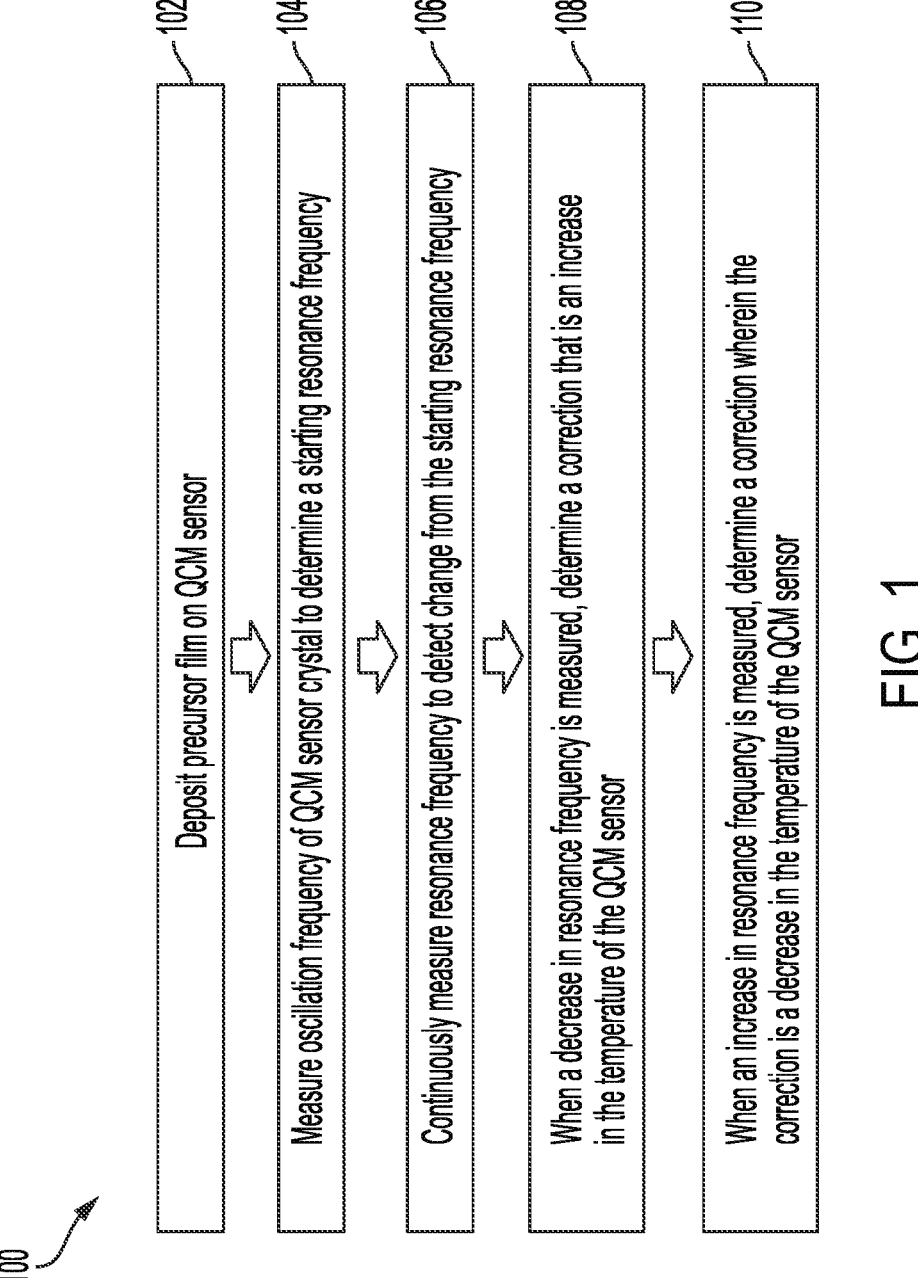

100

102 — Deposit precursor film on QCM sensor

104 — Measure oscillation frequency of QCM sensor crystal to determine a starting resonance frequency 106 — Continuously measure resonance frequency to detect change from the starting resonance frequency 108 — When a decrease in resonance frequency is measured, determine a correction that is an increase in the temperature of the QCM sensor 110 — When an increase in resonance frequency is measured, determine a correction wherein the correction is a decrease in the temperature of the QCM sensor

FIG. 1

SYSTEM AND METHOD FOR MASS FLOW MEASUREMENT AND CONTROL OF PROCESS GASES IN A CARRIER STREAM USING ONE OR MORE QUARTZ CRYSTAL MICROBALANCE SENSORS

CROSS-REFERENCE TO RELATED APPLICATIONS

This application claims the benefit of the filing date and the priority of U.S. Provisional Patent Application No. 63/196,929. The complete specification of said application is hereby incorporated by reference.

TECHNOLOGICAL FIELD

This invention relates generally to the field of microelectronics fabrication and more specifically to a method and system to measure mass flow and control process gases in a carrier stream using one or more quartz crystal microbalance (QCM) sensors.

BACKGROUND

Microelectronics manufacturing (Semiconductor, LCD, OLED, etc. . . . ) relies on a variety of vacuum related processes for the fabrication of devices such as microprocessors, DRAM, 3DNAND, LED cells, or the like. The advancement of semiconductor device technologies (Moore's Law) continues to drive evolution and innovation in manufacturing process technology. For example, the deposition of thin metal films for transistor gates and device interconnects has long been dependent on methods of physical vapor deposition (PVD). PVD remains a staple for depositing metal films and is used throughout the entire integrated circuit (IC) fabrication process. As devices have become increasingly complicated to produce, other deposition methods such as chemical vapor deposition (CVD) have become more prevalent in the field. In general, CVD processes provide more control of the deposited film properties, such as granularity, conformality, and thickness. In recent years, Atomic Layer Deposition (ALD) has become an enabling process technology for advanced semiconductor device manufacturing. ALD is a method by which a monolayer of material can be deposited on a wafer surface. With the ability to deposit a monolayer of material on a substrate surface, the final thickness of the film can be precisely controlled by increasing or decreasing the number of ALD cycles as needed to achieve the target thickness.

In summary, the evolution of deposition technologies employed in microelectronics manufacturing is largely driven by the demand for devices that are increasingly difficult to fabricate. The advancement of semiconductor device technologies has resulted in an ever-increasing variety of process types as well as the increasing precision at which each process step must execute. ALD and CVD are but two broad categories of process types employed in semiconductor manufacturing. There are many other types of processes that are needed to fabricate microelectronic devices.

A typical IC fabrication plant (fab) will employ large numbers of vacuum-based systems (process tools) and utilize many different types of reactive chemistries to pattern devices and circuits on the surface of silicon wafer or other substrates. Process tools may be comprised of batch type reactors in which many substrates are processed at one time, or a process tool may be a cluster of several vacuum chambers each of which processes a single wafer at a time. All reactive process types require the flow of process gases into a vacuum chamber where some desired change is needed on the substrate surface. Semiconductor and display manufacturing methods have become increasingly reliant on precursor materials (process gases) that are difficult to reliably and consistently deliver to the process chamber. Specialized gas delivery subsystems are designed to feed process gases at exactly the right amounts and at exactly the right time for consistent execution of wafer processes. The controlled flow of process gases (gases, volatiles, vapors, etc. . . . ) into process chambers is made more difficult by a lack of means to accurately measure the concentration of the species of interest within a carrier gas flow. An important application for precursor concentration monitoring is process control and reliability. As the aspect ratio of devices increases, the more important it is to precisely control the thickness of the deposited precursor. Since in some cases deposition rate depends upon precursor concentration, monitoring and control of precursor concentration at a precision of 1% or less is necessary. Other factors driving concentration monitors may be film properties that depend upon exact chemical content, such as the gate stack materials in a field effect transistor device.

The problems are exemplified by organic and halide-based precursors that exist as solids or liquids. These precursors are stored in metal vessels (ampoules) that require periodical replacement. To enable precursor flow, heat is applied to volatize the precursor material within the headspace of the ampoule. The precursor vapors released by heat are then transported to a process chamber by a controlled flow of carrier gas through the ampoule. The precursor and carrier gas mixture is then routed to the process chamber though a system of gas lines, valves, and flow controllers. The precursor stream may be further blended or diluted with other gases once it enters the flow path to the process chamber. Throughout the gas delivery system, conditions of state (temperature, pressure, etc.) must be maintained to prevent the precursor gas from condensing at any point in the gas delivery system. However, temperatures throughout the delivery system must not exceed a threshold where thermal decomposition of the precursor gas will occur.

Many traditional types of sensors (optical emission, mass spectrometer, thermal conductivity, etc. . . . ) can be employed to monitor precursor concentration. However, most process gases are a potential source of corrosion or contamination with respect to sensor use, which affects the lifetime of the sensor. Therefore, the design and use of sensors must account for the harsh environments in which they are used while also providing a high degree of sensitivity and accuracy. Harsh environments notwithstanding, precursor concentrations are often quite low relative to carrier gases and other dilution gases that may be introduced to the mix. A sensor must be very selective, sensitive and accurate. Consequently, the cost to deploy such sensors can be impractical.

Without the ability to reliably and unobtrusively measure precursor flow concentration, semiconductor fabs incur unwanted costs due to wafer scrap events. Semiconductor process tools are complex highly automated systems and wafer scrap events (excursions) can often go undetected for significant amounts of time during which one wafer after another is lost due to misprocessing. Gas delivery systems are designed for durable and consistent performance yet they are subject to the effects of drift, component failure, and other modes of errant behavior that result in inadequate precursor flows. In some instances, precursor ampoule depletion can go completely undetected for long periods of time during which process chambers can generate hundreds of scrap wafers. The cost of scrapped wafers is significant in term of direct costs and lost revenue. In addition, wafer scrap imposes additional costs such as redirected labor, lost productivity, and other costs that are associated with preemptive procedures to prevent future scrap events. For example, to minimize the risk of a recurrent wafer scrap event, semiconductor fabs often employ additional methods of in line quality assurance, such as increasing product wafer sampling metrology frequency.

QCM sensors are currently used to monitor the rate of film thickness of a process. Generally, the fundamental mode of resonance of a new monitor quartz crystals is close to 6 MHz. When mass, such as precursor accumulates on the crystal surface, the resonance frequencies of most resonance modes including the shear mode used for monitoring decrease. The novelty of QCM-MFC Method and System makes use of this. In a binary mixture at a given pressure and temperature, the rate of precursor condensation on the crystal surface is directly proportional to the concentration of precursor with respect to the carrier gas. This facilitated by the fact that carrier gas component in the precursor vapor-liquid equilibrium does not condense on to the QCM as the cryogenic temperatures of the carrier gas used in Semi is very low. The invention is also facilitated by the fact that the temperature change due to condensation of a small precursor mass does not alter the local temperature of the QCM which means that the frequency shift (or the phase error) indicates the precursor mass transferred to the QCM due to phase change. If the quartz crystal is held at a temperature below the condensation point of the precursor, there will be continuous accumulation of precursor mass on the quartz crystal. The rate of mass accumulation will vary with differences in precursor concentration and the corresponding rate of crystal frequency change can be used as a feedback signal for the precursor delivery system.

Typically, the QCM sensor is in a mode of constant material accumulation where the rate of mass change on the crystal is used to control rate of evaporation from some material source, e.g., thermal evaporator. However, QCM sensors have a finite capacity to detect mass changes above a certain level of accumulation. The increasing mass accumulation increases attenuation due to scattering and absorption of acoustic waves resulting the resonance quality to degrade. Monitors of QCM resonance cannot detect the resonance below a certain quality factor threshold rendering the QCM unusable as a mass monitor. Therefore, some systems use multiple QCM sensors so that when the first QCM becomes saturated, a second QCM held in reserve replaces the saturated crystal. This can be done by keeping the reserve QCM above the condensation temperature of the precursor.

One disadvantage of using multiple QCMs in this manner is that it has potential to alter mass flow of the precursor in two ways: first, by robbing the delivery of precursor mass flow during for the accumulation mode of the first sensor; and second, by the addition of mass flow when a saturated crystal is being refreshed by heat. Depending on a variety of factors, these effects could result in variations of the precursor partial pressure upstream of chamber impacting the net flow (or dosage) into the process chamber. In general, accumulating and boiling off material within the delivery line can introduce potential risks to precursor delivery stability.

Other systems operate a QCM sensor at temperatures that are high enough to induce thermal decomposition of the precursor compound. In fact, most precursor gases are intended for chemical vapor deposition (CVD) on a heated substrate surface. QCM sensors can be heated to induce CVD on the crystal surface. At tightly controlled temperatures, the rate of mass change (deposition) on the crystal will be directly proportional to the flux of precursor material reaching the crystal. The resulting film on the crystal cannot simply be boiled of as would be the case with condensed material. At certain accumulated film thicknesses, there would be a potential risk of particle shedding. By either mechanism, operating QCM sensors in a mode of constant mass accumulation introduces cost and complexity since crystal saturation must be managed. There are also the risks of altering precursor concentration in the measured stream and, finally, there is increased risk of particle generation if the method of mass loading employs thermal decomposition of precursor on the crystal or due to stress build up with thickness leading to film rupture and particle shedding.

These are just some of the problems associated with the systems and methods of monitoring microelectronics manufacturing currently in use. +

BRIEF SUMMARY OF THE DISCLOSURE

An embodiment of a method for monitoring precursor material in a carrier stream of a fabrication system is provided and includes the following steps:
- (i) depositing a film of precursor material on a surface of a sensor crystal;
- (ii) determining a starting resonance frequency of the sensor crystal with the deposited film of precursor material;
- (iii) measuring the resonance frequency of the sensor crystal during operation of the fabrication system;
- (iv) comparing the measured resonance frequency of the sensor crystal with the starting resonance frequency;
- (v) issuing a system error when the measured resonance frequency differs from the starting resonance frequency by more than a threshold value;
- (vi) automatically implementing a system correction configured to reduce precursor film deposition when the measured resonance frequency is below the starting resonance; and
- (vii) automatically implementing a system correction configured to increase precursor film deposition when the measured resonance frequency is above the starting resonance frequency.

Another embodiment of a method for monitoring precursor material in a carrier stream of a fabrication system is provided and includes the following steps:
- (i) depositing a film of precursor material on a surface of a QCM sensor;
- (ii) determining a starting resonance frequency of the QCM sensor with the deposited film of precursor material;
- (iii) measuring the resonance frequency of the QCM sensor during operation of the fabrication system;
- (iv) comparing the measured resonance frequency of the QCM sensor with the starting resonance frequency;
- (v) issuing a system error when the measured resonance frequency differs from the corresponding starting resonance frequency by more than a threshold value; and
- (vi) automatically implementing a system correction configured to restore the QCM sensor to the starting resonance frequency.

An embodiment of a system for monitoring precursor material in a carrier stream of a fabrication system includes a vacuum process chamber configured to accept one or more workpieces and a precursor source fluidly coupled to the vacuum process chamber. A carrier gas source is fluidly coupled to the vacuum process chamber and a plurality of QCM sensors are positioned along a flow path of the precursor and the carrier gas between the precursor and carrier gas sources and the vacuum process chamber. A control unit is in electrical communication with the plurality of QCM sensors and one or more valves are positioned along the flow path and are in communication with the control unit. The control unit is structured to: (i) control vaporization of the precursor and release of the carrier gas; (ii) determine a starting resonance frequency of each of the plurality of QCM sensors with a deposited film of precursor; (iii) receive measurements of resonance frequencies of the QCM sensor during operation of the fabrication system; (iv) compare the measured resonance frequencies with the corresponding starting resonance frequency; (v) issue a system error when the measured resonance frequencies differ from the corresponding starting resonance frequency by more than a threshold value; and (vi) automatically implementing a correction configured to restore the QCM sensor to the starting resonance frequency.

In an embodiment, the control unit of the system is electrically coupled to a GUI. In another embodiment, the system further includes a heater to heat the precursor in order to release precursor gas into the flow path, wherein the heater is in electrical communication with the control unit. In an embodiment, the correction to restore the QCM sensor to the starting resonance frequency includes increasing or decreasing the temperature of the QCM sensor. In an embodiment, the correction to restore the QCM sensor to the starting resonance frequency includes controlling a precursor delivery system. In an embodiment, the correction to restore the QCM sensor to the starting resonance frequency includes reducing precursor film deposition when the measured resonance frequency is below the starting resonance and increasing precursor film deposition when the measured resonance frequency is above the starting resonance frequency.

BRIEF DESCRIPTION OF DRAWINGS

A more particular description of the invention briefly summarized above may be had by reference to the embodiments, some of which are illustrated in the accompanying drawings. It is to be noted, however, that the appended drawings illustrate only typical embodiments of this invention and are therefore not to be considered limiting of its scope, for the invention may admit to other equally effective embodiments. Thus, for further understanding of the nature and objects of the invention, references can be made to the following detailed description, read in connection with the drawings in which:

FIG. 1 illustrates an example of steps that may be employed when implementing an embodiment of a method for mass flow measurement and control of condensable process gases in a carrier stream using one or more quartz crystal microbalance sensors;

6

Figure 4:
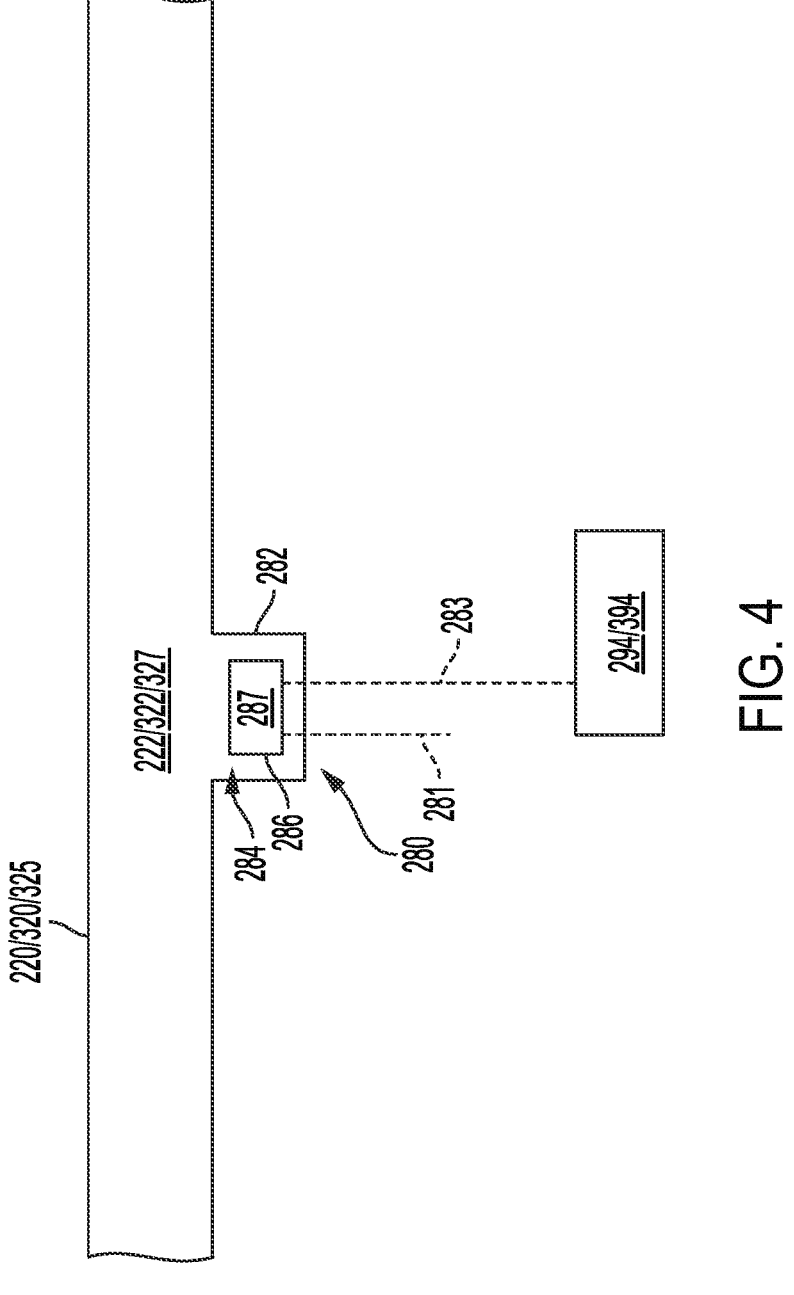

FIG. 4 schematically illustrates another embodiment of a system for mass flow measurement and control of condensable process gases in a carrier stream using one or more quartz crystal microbalance sensors.

DETAILED DESCRIPTION

The following discussion relates to various embodiments of a quartz crystal microbalance sensor for mass flow measurement and control of condensable process gases in a carrier stream. It will be understood that the herein described versions are examples that embody certain inventive concepts as detailed herein. To that end, other variations and modifications will be readily apparent to those of sufficient skill. In addition, certain terms are may be used throughout this discussion in order to provide a suitable frame of reference with regard to the accompanying drawings. These terms such as "upstream", "downstream", "upper", "lower", "forward", "rearward", "interior", "exterior", "front", "back", "top", "bottom", "inner", "outer", "first", "second", and the like are not intended to limit these concepts, except where so specifically indicated. The terms "about" or "approximately" as used herein may refer to a range of 80%-125% of the claimed or disclosed value. With regard to the drawings, their purpose is to depict salient features of the a quartz crystal microbalance sensor for mass flow measurement and control of condensable process gases in a carrier stream and are not specifically provided to scale.

An embodiment of a method 100 for mass flow measurement and control of condensable process gases in a carrier stream using one or more quartz crystal microbalance (QCM) sensors is described with reference to FIG. 1. In the first step 102, a film of condensate precursor (precursor film) is allowed to form on the QCM sensor. The term "film" is used to refer to a layer of matter in any state (unless specified) that ranges from fractions of a nanometer to several micrometers in thickness. In an example, the thickness of the initial film can be on the order of a few nanometers and will depend on several factors including the properties of the precursor being monitored. The required thickness of the initial film is derived from properties of the precursor material (condensation temperature, evaporation temperature) which will vary depending on pressure of the gas lines of the delivery system. The thickness of the precursor film on the QCM sensor at any time point during operation of the system will influence the time response of the measurement system and the potential error in the temperature control circuit. The initial deposition of a precursor film may be part of a priming step as will be described later. The terms "deposit", "depositing" and "deposition" as used herein are not meant to exclude other methods of film formation such as, but not limited to, condensing. A starting resonance frequency is determined for the QCM sensor in step 104, where there is a thin film of precursor deposited on the QCM sensor and the QCM sensor 280 is in a net zero condensation state (where precursor evaporation=precursor condensation). At step 106, continuous measurements of the resonance frequency of the QCM sensor are taken during system operation. Deviations of the resonance frequency from that of the starting resonance frequency are an indication that the system is out of equilibrium or that the QCM sensor is no longer in a state of net zero condensation.

For example in step 108, a condition of net positive condensation occurs if the amount of precursor condensing on the QCM senor is greater than the amount of precursor evaporating from the QCM sensor($\Delta$Mass>0, $\Delta$Frequency QCM<0). When a net positive precursor condensation occurs, the resonance frequencies of all resonance modes (including the shear mode) used for monitoring decrease. This state could be the result of an intended increase in precursor concentration moving through the QCM sensor or an intended decrease in temperature. However, net positive precursor condensation could also be the result of a system failure or a failure in providing an adequate amount of carrier gas or other constituent. This change in resonance frequency may result in a system error or phase error and is used to determine a correction. The correction in this example is an increase in the temperature of the QCM sensor. Once the correction is implemented, the system error is eliminated. Similarly in step 110, if a condition of net negative condensation occurs, then the amount of precursor condensing on the QCM senor is less than the amount of precursor evaporating from the QCM sensor. When a net negative precursor condensation occurs, the resonance frequencies increase. This state could be the result of an intended decrease in precursor concentration moving over or through the QCM sensor or an intended increase in temperature. However, net negative precursor condensation could also be the result of a system failure or a failure in providing an adequate amount of precursor in the carrier stream. This decrease in resonance frequency may result in a system error and is used to determine a correction. The correction in this example a decrease in the temperature of the QCM. Once the system correction is implemented, the system error is eliminated.

By holding the QCM sensor to a constant frequency of oscillation (ΔFrequency QCM=0), the temperature of the QCM sensor will be constantly sensing for the precise condensation temperature of the precursor, which will vary depending on variables of state (pressure, temperature, etc. . . . ) and the concentration of the precursor relative to the carrier gas. Corrections to the QCM temperature can then be used as a feedback to control the precursor delivery systems. Such corrections may be based on factors such as carrier gas flow rate and precursor ampoule temperature.

In an embodiment, a method for controlling the temperature of the QCM sensor is disclosed such that the rate of condensation of precursor on the QCM sensor is equal to the rate of evaporation of condensed precursor from the QCM sensor. This method prevents crystal saturation and minimizes or eliminates the risk of the measurement process impacting flow concentration to the vacuum process chamber. Once the QCM sensor has achieved equilibrium, there is a zero net mass flow at the crystal of the QCM sensor.

In another embodiment of the method, the QCM sensor(s) are used as partial pressure controllers for precursor in a precursor/carrier gas mix. This embodiment of the method may be used with liquid and solid precursors. In this method, the QCM sensor(s) are operated close to super saturation for a given pressure. A phase error is induced when there is excess precursor evaporation from the QCM sensor and can be used to control precursor concentration in the carrier stream upstream from the QCM sensor by controlling vaporization of the precursor.

An embodiment of a method for monitoring precursor in a carrier stream comprises providing a QCM sensor comprising a sensor crystal, depositing a film of precursor on a surface of a QCM sensor crystal, and determining a starting resonance frequency of the QCM sensor crystal with the deposited film. The resonance frequency of the QCM sensor crystal is measured during operation of the fabrication system and compared with the starting resonance frequency. When the measured resonance frequency is less than the starting resonance frequency, a temperature of the sensor crystal is increased until the measured resonance frequency equals the starting resonance frequency. When the measured resonance frequency is greater than the starting resonance frequency, a temperature of the sensor crystal is decreased until the measured resonance frequency equals the starting resonance frequency.

Another embodiment of a method for monitoring precursor in a carrier stream comprises providing a QCM sensor comprising a sensor crystal, depositing a film of precursor on the QCM sensor crystal, and determining a starting resonance frequency of the sensor crystal with the deposited film. The resonance frequency of the QCM sensor crystal is continuously measured during operating of the fabrication system and compared to the starting resonance frequency. When the measured resonance frequency deviates from the starting resonance frequency by more than a threshold value, a system correction is automatically implemented in response to such deviation that restores the QCM sensor crystal to the starting resonance frequency.

The measurement and control method 100 may be implemented through a variety of types of assemblies and systems, including electromechanical equipment, energy sources, computer hardware (e.g., data processors, servers, controllers, display devices, input devices and output devices), computer programs (e.g., embedded software and application software), and application-specific integrated circuits.

Figure 2:
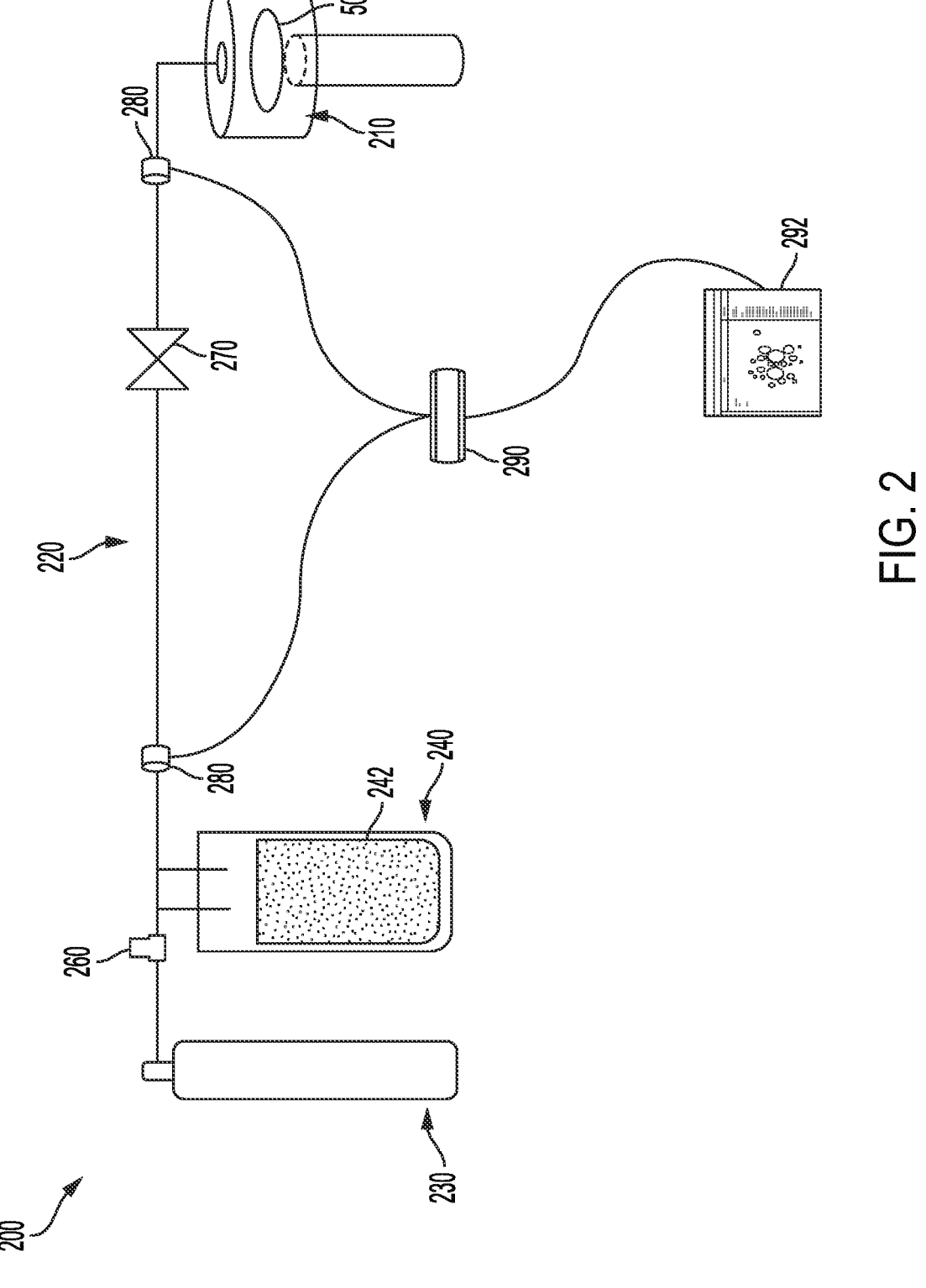
FIG. 2 schematically illustrates an embodiment of a system for mass flow measurement and control of condensable process gases in a carrier stream using one or more quartz crystal microbalance sensors.
Figure 3:
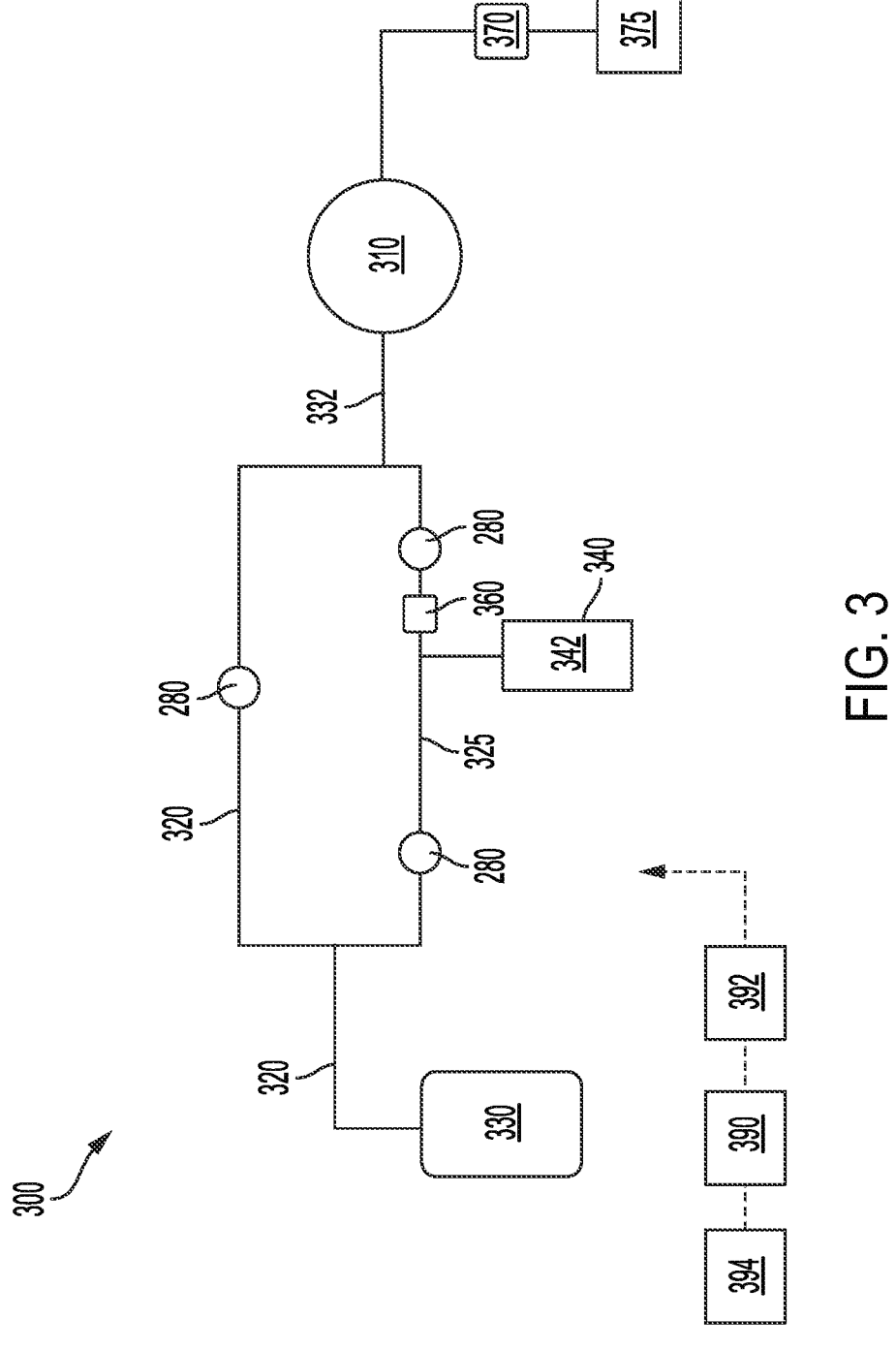
FIG. 3 schematically illustrates an embodiment of a QCM sensor of the system for mass flow measurement and control of condensable process gases in a carrier stream using one or more quartz crystal microbalance sensors.

FIGS. 2 and 3 schematically depict embodiments of a systems 200, 300 to monitor the fabrication of microelectronic devices such as semiconductors that implement one or more of the methods discussed above. Referring first to FIG. 2, the system 200 generally comprises a vacuum process chamber 210 that is configured to accept one or more workpieces or substrates 50 used to fabricate the desired microelectronic device. In an embodiment, the substrate is a wafer comprised of silicon The vacuum process chamber 210 is connected to one or more material sources via one or more supply lines or conduits 220. Two sources are shown in FIG. 2 where one source is a source of a carrier gas 230 and the other source is a precursor source 240. The precursor source 240 may be an ampoule configured to hold a liquid or solid state precursor material 242 that would commonly be used during microelectronic device fabrication. The precursor material 242 may be heated such that it vaporizes and is transported by the carrier gas through the supply conduits 220 to the vacuum process chamber 210 where the precursor decomposes to form a thin solid film onto a surface of the substrate 50 positioned within the vacuum process chamber 210.

A Mass Flow Controller (MFC) 260 may be positioned within or may otherwise be coupled to the supply conduit 220 so that it is exposed to the carrier gas and/or precursor 242 flowing through the supply conduit 220. The MFC is used to measure and control the flow rate of the carrier gas and/or precursor 242 along the supply conduit 220. One or more pressure control valves 270 may be positioned to control the pressure within the supply conduit 220. In an embodiment, the one or more pressure control valves 270 may comprise an Atomic Layer Deposition (ALD) valve. In an embodiment, the ALD valve may comprise three ports where the first port is connected to a conduit leading to the carrier gas source 230 and the second port is connected to a conduit that leads to the precursor source 240. The third port is connected to the supply line 220. In this embodiment, the ALD valve may be configured to control the mixture or ratio of the carrier gas and precursor vapor.

Still referring to FIG. 2, QCM sensors 280 are positioned at one or more points along the flow path of the precursor gas through the supply conduit 220. As shown in the example illustrated in FIG. 2, two (2) QCM sensors 280 are part of the system 200 with a first QCM sensor 280 being positioned before or upstream of the pressure control 270 valve. As shown, a second QCM sensor 280 positioned downstream of the pressure control valve 270 but before the supply conduit 220 meets the vacuum process chamber 210. The two QCM sensors 280 shown on the system 200 may be identical to each other. Other embodiments of the system (such as the system 300 of FIG. 4) may include fewer or more QCM sensors 280 positioned as necessary. Each QCM sensor 280 is in electrical communication with a control unit 290 such as a sensor control unit, which in turn is in electrical communication with a graphic user interface (GUI)/Processor 292. The control unit 290 and/or the processor 292 may be in communication with one or more of the valves 270 including valves controlling release of precursor and carrier gas, the MFC, 260, and the heater at the precursor source 240.

FIG. 3 shows a schematic depiction of another embodiment of a system 300 to monitor the fabrication of microelectronic devices such as semiconductors. The system 300 generally comprises a vacuum process chamber 310 that is configured to accept one or more workpieces or substrates used to fabricate the desired microelectronic device. In an embodiment, the substrate is a wafer comprised of silicon. The vacuum process chamber 310 is connected to one or more material sources via one supply line or conduit 325 and one dilution line or conduit 320. As shown, the system 300 comprises a dilution line 320 and a precursor line 325. Two sources are shown in FIG. 3 where one source is a source of a carrier gas 330 and the other source is a precursor source 340. The precursor source 340 may be an ampoule configured to hold a liquid or solid state precursor material 342 that would commonly be used during microelectronic device fabrication. The precursor material 342 may be heated such that it vaporizes and is transported by the carrier gas through the supply conduit 325 and further diluted by the dilution conduit 320 to bring the precursor/carrier mixture to the vacuum process chamber 310 where the precursor decomposes to deposit a film onto a surface of the substrate positioned within the vacuum process chamber 310.

A Mass Flow Controller (MFC) 360 may be positioned within or may otherwise be coupled to the supply conduit 325 so that it is exposed to the carrier gas and/or precursor 342 flowing through the supply conduit 325. The MFC is used to measure and control the flow rate of the carrier gas and/or precursor 342 along the supply conduit 325. One or more pressure control valves 370 and a vacuum 375 may be positioned to control the pressure within the system 300.

Still referring to FIG. 3, QCM sensors 280 are positioned at three (3) or more points along the flow path of the precursor and carrier gas through the system 300. As shown in FIG. 3, one (1) QCM sensor 280 is positioned along the dilution line 320 and two (2) QCM sensors 280 are positioned along the precursor line 325 of the system 300, such that all of the QCM sensors 280 are positioned before or upstream of the vacuum process chamber 310. The QCM sensors 280 shown as part of the system 300 may be identical to each other. Other embodiments of the system may include fewer or more QCM sensors 280 positioned as necessary. Each QCM sensor 280 is in electrical communication with a control unit 390, such as a sensor control unit, which may include or is in turn is in electrical communication with a graphic user interface (GUI)/Processor 392. The control unit 390 and/or the processor 392 may be in communication with one or more of the valves 370 including valves controlling release of precursor and carrier gas, the MFC, 360, and the heater at the precursor source 340.

FIG. 4 illustrates a schematic depiction of an embodiment of a QCM sensor 280 that may be used in the systems 200, 300. The QCM sensor 280 may comprise a housing 282 defining a space 284 that at least partially surrounds a piezoelectric (oscillating) crystal 286, such as a quartz crystal. As shown, the housing 282 opens into an inner space 222/322/327 of the supply conduit 220/320/325 such that the crystal 286 is exposed to the carrier gas and precursor moving through the supply conduit 220/320/325. The QCM sensor 280 further includes one or more connections such as electrical connections. As shown, there is a controller connection 281 that electrically couples the QCM sensor 280 to a control unit 290/390 such as a sensor control unit. A temperature control connection 283 may couple the QCM sensor 280 to one or more temperature control units 294/394. In an embodiment, the temperature control units comprise one or more Peltier elements contacting the crystal 286 and aid in adjusting the temperature of the QCM sensor 280 and the crystal 286. The one or more temperature control units 294/394 may be configured to be in electrical communication with the GUI/Processor 292/392. The one or more temperature control units 294/394 may be the same unit used to control the temperature of other components in the system 200, 300 such as the supply conduit 220/320, or may be a separate unit. In another embodiment, the one or more temperature control units 294 are in communication with the control unit 290/390. The one or more temperature control units 294, 394 may include at least one cooling device and at least one heating device. The at least one heating device may comprise of resistance heaters, or thermoelectric (TE) heaters, heating gases, or liquids via closed loop circulation system(s). The at least one cooling device may comprise of thermoelectric (TE) coolers, liquid coolant or cooling gases incorporated into the QCM sensor 280. The at least one heating/cooling device may comprise a Peltier element configured to heat or cool the QCM sensor depending on the amount of electrical current it receives.

The systems 200, 300 use the QCM sensors 280 for real-time measurement of precursor concentration in a carrier gas stream for mass flow measurement and control. During operation of the system 200, 300, the QCM sensors 280 respond to mass changes that occur on the crystal 286 of the QCM sensor 280. For example, the quartz crystal 286 of the QCM sensor 280 oscillates at a certain fundamental frequency, e.g., 6 MHz. When mass accumulates on the crystal 286, the resonance frequencies of all resonance modes (including the shear mode used for monitoring) decrease resulting in a downward shift of the fundamental frequency ($\Delta$Mass>0, $\Delta$Frequency QCM<0).

Prior to operation within the systems 200, 300, the QCM sensors 280 (and the MPC 260/360) are primed for measurement and control. During the priming sequence or step, the temperature of the QCM sensor 280 is gradually increased to a temperature above the condensation temperature of the precursor. The precursor/carrier gas mixture is then enabled to flow through the supply conduit 220/320/325 over or through the QCM sensor 280. The temperature of the QCM sensor 280 is then gradually decreased to a temperature setpoint until a condensate film of precursor forms on the QCM sensor 280 (sensor crystal 286). This temperature setpoint depends on how much oversaturation is required as well as safety concerns and sensitivity. The resonance frequency of the QCM 280 at the setpoint temperature is the starting resonance frequency. Once the priming sequence is compete and the temperature of the QCM sensor 280 is set to a steady state and is ready to operate, the system 200, 300 may operate in a monitor mode or a control mode. Operation of the system will now be discussed with reference to the system 300 of FIG. 3, however the system of FIG. 2 may be operated in a similar manner.

Referring to FIG. 3, when the system 300 is operated in the monitor mode, a change in the equilibrium or steady state will not use the error signal to change the frequency of the driving source to QCM sensor 280 to match the changed resonance frequency. A change in equilibrium or steady state occurs (change in frequency from the starting resonance frequency) when a change in the partial pressure of the precursor occurs, which causes a change in the rate of evaporation/condensation from the QCM sensor 280. For example, when the system 300 is operated in monitor mode and a change in the steady state is detected by the control unit 390 and transmitted to the processor 392, the temperature control unit 394 adjusts the temperature of the QCM sensor 280 (or the current to the Peltier element). The temperature of the QCM sensor 280 is adjusted until the error signal from QCM is reduced to zero 280 which then implies the starting resonance frequency of the QCM is restored. This temperature correction (or change in current to the Peltier element) indicates a change in the partial pressure of the precursor in the carrier stream. The system 300 may be operated in an open or closed loop.

In an open loop the system is operated in a monitor mode. For example, when a change in equilibrium or steady state occurs (change in frequency from the starting resonance frequency) it is an indication of a change in the partial pressure of the precursor. This change is manually offset by adjusting the temperature of the QCM sensor 280 by a process engineer until the QCM sensor 280 returns to the starting resonance frequency. The temperature adjustment may be accomplished by the process engineer interacting with the processor/display 392. In an embodiment, the process engineer implements a change in the current delivered to the Peltier element. Alternatively in a closed loop configuration, an automatic correction can be determined by the processor 392 and fed to the control unit 390 and/or temperature control unit 394. When a change in equilibrium or steady state occurs (change in frequency from the starting resonance frequency) thereby indicating a change in the partial pressure of the precursor occurs, the change is detected by the control unit 390 and transmitted to the processor/display 392. The processor 392 is configured to control the vaporization of the precursor as well as the release of carrier gas. The processor 392 determines a correction in the partial pressure of the precursor based on the error signal from the QCM sensor 280. For example, when the equilibrium is shifted to a net evaporation of precursor from the QCM sensor 280, the processor 392 may increase the rate of vaporization of precursor 342 from the precursor source 340 until the QCM sensor 280 returns to the starting resonance frequency.

Of course, components of the system 200, 300 used for gas delivery, such as the supply conduits 220, 320, 325, must be heated to prevent condensation of vaporized precursor species. However, the temperature of the system 200, 300 must be low enough so as not to induce thermal decomposition of the precursor molecules within the gas delivery components. Such an effect would be considered a fault condition to be avoided.

While the present invention has been particularly shown and described with reference to certain exemplary embodiments, it will be understood by one skilled in the art that various changes in detail may be effected therein without departing from the spirit and scope of the invention that can be supported by the written description and drawings. Further, where exemplary embodiments are described with reference to a certain number of elements, it will be understood that the exemplary embodiments can be practiced utilizing either less than or more than the certain number of elements.

The invention claimed is:

1. A method for monitoring precursor material in a carrier stream of a fabrication system, comprising:
   depositing a film of precursor material on a surface of a sensor crystal;
   determining a starting resonance frequency of the sensor crystal with the deposited film of precursor material;
   measuring the resonance frequency of the sensor crystal during operation of the fabrication system;
   comparing the measured resonance frequency of the sensor crystal with the starting resonance frequency;
   issuing a system error when the measured resonance frequency differs from the starting resonance frequency by more than a threshold value;
   automatically implementing a system correction configured to reduce precursor film deposition when the measured resonance frequency is below the starting resonance; and
   automatically implementing a system correction configured to increase precursor film deposition when the measured resonance frequency is above the starting resonance frequency.

2. The method of claim 1, wherein the system correction comprises increasing a temperature of the sensor crystal.

3. The method of claim 1, wherein the system correction comprises decreasing a temperature of the sensor crystal.

4. The method of claim 1, wherein the system correction is configured to control a precursor delivery system.

5. A method for monitoring precursor material in a carrier stream of a fabrication system, comprising:
   depositing a film of precursor material on a surface of a QCM sensor;
   determining a starting resonance frequency of the QCM sensor with the deposited film of precursor material;
   measuring the resonance frequency of the QCM sensor during operation of the fabrication system;
   comparing the measured resonance frequency of the QCM sensor with the starting resonance frequency;
   issuing a system error when the measured resonance frequency differs from the corresponding starting resonance frequency by more than a threshold value; and
   automatically implementing a system correction configured to restore the QCM sensor to the starting resonance frequency.

6. The method of claim 5, wherein the system correction comprises increasing a temperature of the QCM sensor.

7. The method of claim 5, wherein the system correction comprises decreasing a temperature of the QCM sensor.

8. The method of claim 5, wherein the system correction is configured to control a precursor delivery system.

9. The method of claim 5, wherein the system correction is configured to reduce precursor film deposition when the measured resonance frequency is below the starting resonance, and wherein the system correction is configured to increase precursor film deposition when the measured resonance frequency is above the starting resonance frequency.

10. A system for monitoring precursor material in a carrier stream of a fabrication system, the system comprising:

a vacuum process chamber configured to accept one or more workpieces;

a precursor source fluidly coupled to the vacuum process chamber;

a carrier gas source fluidly coupled to the vacuum process chamber;

a plurality of QCM sensors positioned along a flow path of the precursor and the carrier gas between the precursor and carrier gas sources and the vacuum process chamber;

a control unit in electrical communication with the plurality of QCM sensors;

one or more valves positioned along the flow path and in communication with the control unit;

wherein the control unit is configured to, control vaporization of the precursor and release of the carrier gas, determine a starting resonance frequency of each of the plurality of QCM sensors with a deposited film of precursor, receive measurements of resonance frequencies of the QCM sensor during operation of the fabrication system, compare the measured resonance frequencies with corresponding starting resonance frequency, issue a system error when the measured resonance frequencies differ from the corresponding starting resonance frequency by more than a threshold value, and automatically implementing a correction configured to restore the QCM sensor to the starting resonance frequency.

11. The system of claim 10, wherein the control unit is electrically coupled to a GUI.

12. The system of claim 10, further comprising a heater configured to heat the precursor to release precursor gas into the flow path, wherein the heater is in electrical communication with the control unit.

13. The system of claim 10, wherein the correction comprises increasing a temperature of the QCM sensor.

14. The system of claim 10, wherein the correction comprises decreasing a temperature of the QCM sensor.

15. The system of claim 10, wherein the correction is configured to control a precursor delivery system.

16. The system of claim 15, wherein the correction is configured to reduce precursor film deposition when the measured resonance frequency is below the starting resonance, and wherein the correction is configured to increase precursor film deposition when the measured resonance frequency is above the starting resonance frequency.

17. The method of claim 1, wherein the starting resonance frequency comprises a state where a precursor evaporation from the sensor crystal is equal to a precursor condensation such that a net zero condensation state exists.

18. The method of claim 5, wherein the QCM sensor comprises a sensor crystal, and wherein the starting resonance frequency comprises a state where a precursor evaporation from the sensor crystal is equal to a precursor condensation such that a net zero condensation state exists.

19. The system of claim 10, wherein the QCM sensor comprises a sensor crystal, and wherein the starting resonance frequency comprises a state where a precursor evaporation from the sensor crystal is equal to a precursor condensation such that a net zero condensation state exists.

* * * * *